US007831896B2

(12) United States Patent
Amram et al.

(10) Patent No.: US 7,831,896 B2
(45) Date of Patent: Nov. 9, 2010

(54) ITERATIVE FORWARD ERROR CORRECTION (75) Inventors: Noam Amram, Holon (IL); Leonid Entin, Modiin (IL)

(73) Assignee: Runcom Technologies, Ltd., Rishon Lezion (IL)

( * ) Notice: Subject to any disclaimer, the term of this patent is extended or adjusted under 35 U.S.C. 154(b) by 1186 days.

(21) Appl. No.: 10/571,336

(22) PCT Filed: Sep. 7, 2004

(86) PCT No.: PCT/IL2004/000805

§ 371 (c)(1),
(2), (4) Date: Mar. 7, 2006

(87) PCT Pub. No.: WO2005/025106

PCT Pub. Date: Mar. 17, 2005

(65) Prior Publication Data

US 2007/0044005 A1 Feb. 22, 2007

(30) Foreign Application Priority Data

Sep. 11, 2003 (IL) .................................. 157885

(51) Int. Cl.
*G06F 11/00* (2006.01)
(52) U.S. Cl. .................. 714/804; 714/776; 714/701
(58) Field of Classification Search .............. 714/804, 714/755, 776, 777, 759, 701; 370/389, 474; 375/130
See application file for complete search history.

(56) References Cited

U.S. PATENT DOCUMENTS

| 5,247,575 | A | 9/1993 | Sprague et al. |
| 5,247,576 | A | 9/1993 | Bright |
| 5,361,402 | A | 11/1994 | Grube et al. |
| 5,406,613 | A | 4/1995 | Peponides et al. |
| 5,541,927 | A | 7/1996 | Kristol et al. |
| 5,691,995 | A | 11/1997 | Ikeda et al. |
| 5,727,002 | A | 3/1998 | Miller et al. |
| 5,748,736 | A | 5/1998 | Mittra |
| 5,757,813 | A | 5/1998 | Raith |
| 5,774,668 | A | 6/1998 | Choquier et al. |

(Continued)

FOREIGN PATENT DOCUMENTS

EP    1 100 207    5/2001

(Continued)

OTHER PUBLICATIONS

Roth et al., "Reduced-Redundancy Product Codes for Burst Error Correction", IEEE Transactions on Information Theory, vol. 44, No. 4, Jul. 1998, p. 1395-1406.

(Continued)

*Primary Examiner*—Fritz Alphonse
(74) *Attorney, Agent, or Firm*—Robert G. Lev (57) ABSTRACT A method of preparing data for transmission. The method includes providing a block of data, generating a plurality of first dimension code words including first dimension forward error correction FEC elements, the elements of each code word may be used interchangeably to reconstruct a data portion of the block corresponding to the code word, defining a plurality of second dimension source words formed of the generated elements and generating for at least two of the defined second dimension source words, different numbers of parity elements.

17 Claims, 3 Drawing Sheets

U.S. PATENT DOCUMENTS

| | | | |
|---|---|---|---|
| 5,862,329 | A | 1/1999 | Aras et al. |
| 5,887,252 | A | 3/1999 | Noneman |
| 5,896,566 | A | 4/1999 | Averbuch et al. |
| 5,905,871 | A | 5/1999 | Buskens et al. |
| 5,978,368 | A | 11/1999 | Hjelm et al. |
| 5,983,388 | A | 11/1999 | Friedman et al. |
| 5,987,137 | A | 11/1999 | Karppanen et al. |
| 6,014,089 | A | 1/2000 | Tracy et al. |
| 6,046,980 | A | 4/2000 | Packer |
| 6,065,147 | A | 5/2000 | Pyndiah et al. |
| 6,104,709 | A | 8/2000 | Rinchiuso et al. |
| 6,104,929 | A | 8/2000 | Josse et al. |
| 6,108,706 | A | 8/2000 | Birdwell et al. |
| 6,115,754 | A | 9/2000 | Landgren |
| 6,122,483 | A | 9/2000 | Lo et al. |
| 6,141,347 | A | 10/2000 | Shaughnessy et al. |
| 6,144,651 | A | 11/2000 | Rinchiuso et al. |
| 6,157,963 | A | 12/2000 | Courtright, II et al. |
| 6,188,911 | B1 | 2/2001 | Wallentin |
| 6,260,168 | B1 | 7/2001 | Godoroja |
| 6,269,080 | B1 | 7/2001 | Kumar |
| 6,320,873 | B1 | 11/2001 | Nevo et al. |
| 6,324,570 | B1 | 11/2001 | Tonchev et al. |
| 6,331,983 | B1 | 12/2001 | Haggerty et al. |
| 6,339,594 | B1 | 1/2002 | Civanlar et al. |
| 6,351,467 | B1 | 2/2002 | Dillon |
| 6,360,076 | B1 | 3/2002 | Segura et al. |
| 6,370,153 | B1 | 4/2002 | Eng |
| 6,445,717 | B1 | 9/2002 | Gibson et al. |
| 6,453,438 | B1 | 9/2002 | Miller et al. |
| 6,477,149 | B1 | 11/2002 | Okanoue |
| 6,526,538 | B1 | 2/2003 | Hewitt |
| 6,553,540 | B1 | 4/2003 | Schramm et al. |
| 6,563,822 | B1 | 5/2003 | Aoki |
| 6,570,851 | B1 | 5/2003 | Koskelainen et al. |
| 6,640,248 | B1 | 10/2003 | Jorgensen |
| 6,671,307 | B2 * | 12/2003 | Schilling ............... 375/130 |
| 6,728,878 | B2 | 4/2004 | Dillon |
| 6,741,575 | B1 | 5/2004 | Zhang et al. |
| 7,093,028 | B1 | 8/2006 | Shao et al. |
| 7,096,357 | B1 | 8/2006 | Tochikubo et al. |
| 7,249,291 | B2 * | 7/2007 | Rasmussen et al. ....... 714/701 |
| 7,289,500 | B1 | 10/2007 | Amlekar |
| 7,296,091 | B1 | 11/2007 | Dutta et al. |
| 7,359,403 | B1 | 4/2008 | Rinne |
| 7,424,661 | B2 | 9/2008 | Fujimoto |
| 2001/0032245 | A1 | 10/2001 | Fodor |
| 2002/0006801 | A1 | 1/2002 | Siren |
| 2002/0012327 | A1 | 1/2002 | Okada |
| 2002/0038441 | A1 | 3/2002 | Eguchi et al. |
| 2002/0039361 | A1 | 4/2002 | Imamura et al. |
| 2002/0057798 | A1 | 5/2002 | Zhang |
| 2002/0064282 | A1 | 5/2002 | Loukianov et al. |
| 2002/0065093 | A1 | 5/2002 | Yi et al. |
| 2002/0066026 | A1 | 5/2002 | Yau et al. |
| 2002/0075824 | A1 | 6/2002 | Willekes et al. |
| 2002/0078361 | A1 | 6/2002 | Giroux et al. |
| 2002/0080755 | A1 | 6/2002 | Tasman et al. |
| 2002/0085536 | A1 | 7/2002 | Rudrapatna |
| 2002/0086665 | A1 | 7/2002 | Maggenti et al. |
| 2002/0087623 | A1 | 7/2002 | Eatough |
| 2002/0102967 | A1 | 8/2002 | Chang et al. |
| 2002/0106985 | A1 | 8/2002 | Sato et al. |
| 2002/0115454 | A1 | 8/2002 | Hardacker |
| 2002/0126850 | A1 | 9/2002 | Allen et al. |
| 2002/0136407 | A1 | 9/2002 | Denning et al. |
| 2002/0138826 | A1 | 9/2002 | Peterka |
| 2002/0174366 | A1 | 11/2002 | Peterka et al. |
| 2002/0178221 | A1 | 11/2002 | Yaport et al. |
| 2002/0198013 | A1 | 12/2002 | Panasik et al. |
| 2003/0002499 | A1 * | 1/2003 | Cummings et al. .......... 370/389 |
| 2003/0007499 | A1 | 1/2003 | Rajahalme |
| 2003/0021286 | A1 | 1/2003 | Boscovic et al. |
| 2003/0039225 | A1 | 2/2003 | Casati et al. |
| 2003/0046539 | A1 | 3/2003 | Negawa |
| 2003/0051159 | A1 | 3/2003 | McCown et al. |
| 2003/0073453 | A1 | 4/2003 | Basilier |
| 2003/0100325 | A1 | 5/2003 | Paila et al. |
| 2003/0147392 | A1 | 8/2003 | Hayashi et al. |
| 2003/0163355 | A1 | 8/2003 | Kaiser et al. |
| 2003/0204603 | A1 | 10/2003 | Buchanan |
| 2004/0014489 | A1 | 1/2004 | Miyachi et al. |
| 2004/0017825 | A1 | 1/2004 | Stanwood et al. |
| 2004/0057376 | A1 | 3/2004 | Sasvari et al. |
| 2004/0125773 | A1 | 7/2004 | Wilson et al. |
| 2004/0187124 | A1 | 9/2004 | Labelle |
| 2004/0233907 | A1 | 11/2004 | Hundscheidt et al. |
| 2005/0030966 | A1 | 2/2005 | Cai et al. |
| 2005/0136906 | A1 | 6/2005 | Azuma |
| 2005/0283447 | A1 | 12/2005 | Xu et al. |
| 2006/0089128 | A1 | 4/2006 | Smith et al. |
| 2006/0094410 | A1 | 5/2006 | Cortegiano |
| 2007/0028099 | A1 | 2/2007 | Entin et al. |
| 2007/0173269 | A1 | 7/2007 | Laroia et al. |

FOREIGN PATENT DOCUMENTS

| | | |
|---|---|---|
| EP | 0 931 383 | 4/2003 |
| GB | 2414635 | 11/2005 |
| WO | WO 93/20637 | 10/1993 |
| WO | WO 00/21253 | 4/2000 |
| WO | WO 03/019840 | 3/2003 |
| WO | WO 2004/079964 | 9/2004 |
| WO | WO 2006/012911 | 2/2009 |

OTHER PUBLICATIONS

Breitbach et al.; Array Codes Correcting a Two-Dimensional Cluster of Errors'; IEEE Transactions on Information Theory, vol. 44, No. 5, Sep. 1998.

Länsisalmi, "Radio Access Network Architecture. Wideband CDMA systems", 2001, COMLAB.HUT.fi, all pages.

Chong, "WCDMA Physical Layer", Jan. 31, 2002, COMLAB.HUT.fi, all pages.

Chong, "UTRAN Radio Interface Protocols", Feb. 6, 2002, COMLAB.HUT.fi, all pages.

Chong, "Radio Resource Management", Feb. 14, 2002, COMLAB.HUT.fi, all pages.

Tuominen, "Radio Access Network Architecture", Jan. 30, 2002, COMLAB.HUT.fi, all pages.

Rosenbrock, "The ETSI UMTS Terrestrial Radio Access (UTRA) ITU-R RTT Candidate Submission", Jun. 1998, ETSI SMG2, all pages.

Rizzo, "Effective erasure codes for reliable computer communication protocols", Apr. 1997, ACM SIGCOMM Computer Communication Review, vol. 27, Issue 2, pp. 24-36.

Levinson M.,"The MIME Multipart/Related Content-type", Aug. 1998, available from Internet: http://www.ietf.org/rfc/rfc2387.txt?number=2387.

GSM technical specification: "3rd Generation Partnership Project; Technical Specification Group Services and System Aspects; GPRS Service description; Stage 2; (Release 1997);"GSM Group; identified as 3GPP TS 03.60 V6.9.0 (Jun. 2001); Available from Internet: ftp://ftp.3gpp.org/Specs/2001-06/R1997/03_series/0360-690.zip; pp. 1-106.

CISCO;"GPRS White Paper"; Retrived from Internet:http://www.cisco.com/warp/public/cc/so/neso/gprs/gprs_wp.pdf; Retrieved on Aug. 22, 2001; p. 1-19.

* cited by examiner

FIG.3

ITERATIVE FORWARD ERROR CORRECTION

RELATED APPLICATIONS

The present application is a US National Phase of PCT Application No. PCT/IL2004/000805, filed on Sep. 7, 2004, published as WO 2005/025106 the disclosure of which is incorporated herein by reference.

FIELD OF THE INVENTION

The present invention relates generally to communication networks and particularly to method of forward error corrections.

BACKGROUND OF THE INVENTION

In transmission of data packets over packet based networks, there is a possibility of packet loss, such that it may be assumed that a certain percentage of packets are lost on any packet based network. Packets may be lost due to channel conditions and/or due to application operation, for example late tuning onto a data transmission. In some cases, such as transfer of a file, the loss of even a small percentage of the transmitted data prevents the use of the entire file.

In some cases, redundant data is transmitted along with the transmitted data, such that even if some of the transmitted data is lost, the original data can be reconstructed from the data that was received. One method of redundancy is referred to as forward error correction (FEC). In accordance with a simple FEC code, the protected data is included in a single source word (also referred to as a block), divided into a set X of k source elements (original elements). For the single source word, n>k code elements (referred to also as FEC elements), of the same size as the source elements, are generated, in order to represent the source words in a protected manner. The n code elements are referred to together as a code word. The elements may be of different sizes, such as single bits or packets. A receiver needs to receive correctly any k+z elements (z>=0) from the transmitted code word in order to reconstruct the source word. When z=0 the code is considered optimal.

Various coding methods of generating the code elements from the source elements, are known in the art. One of the attributes of coding methods is the ratio k/n, which is referred to as the code rate. The code rate used depends on the expected data loss rate, the importance of the data and the available bandwidth.

Generally, there exist efficient coding methods only for several coding rates. When it is desired to have a code rate that does not have an efficient coding method, a method with a lower code rate (i.e., a higher n for the same k) is used to generate the code elements, and then some of the code elements are dropped The dropped code elements are referred to as punctured elements. In some cases, punctured elements are retransmitted, instead of or in addition to other code elements not correctly received.

If the source word is a subset of the code word (i.e., X is a subset of Y), the code is referred to as a systematic code. The portion of the code word not included in the source word is referred to as a parity word. Codes in which the source word is not a subset of the code word are referred to as non-systematic codes.

When possible, it is considered advantageous to include an entire data file in a single source word, for which a single code word is generated. The available codes, however, such as the Reed Solomon (RS) code, require large processing resources when the source word is large. In order to reduce the processing power required, in one-dimensional codes (known also as single dimension codes), the original data is divided into a plurality of source words and code words are generated for each source word independently.

As the size of the original data increases, the number of source words increases, and therefore the chances of successfully reconstructing the original data decreases, since all the source words need to be reconstructed independently. Excess elements (beyond k+z) received for one of the source words does not aid in the reconstruction of other source words for which a sufficient number of elements was not received.

In an exemplary two-dimensional code, the original data is arranged in a two-dimensional array. Each row and each column of the array is viewed as a separate source word, for which a code word is generated. In the data reconstruction, the elements of each row code word which is successfully reconstructed can be used in the reconstruction of column code words and vice versa. An iterative "column-row" reconstruction method is generally used to reconstruct the data.

For substantially the same complexity (i.e., processing resources), the two-dimensional FEC requires less bandwidth than the one-dimensional FEC. For high-loss transmission links and for short original data, the two-dimensional FEC becomes inefficient.

SUMMARY OF THE INVENTION

An aspect of some embodiments of the invention relates to a multi-dimension (e.g., two dimensional) code in which parity elements are generated, in one dimension, for punctured elements, which were not transmitted, of a different dimension. Optionally, parity elements are generated for an entire row of punctured elements and only the parity elements (and not the punctured elements themselves) are transmitted. The term parity elements refers herein to the elements beyond the k elements of a code word required in order to reconstruct the source word corresponding to the code word. The parity elements may include the code elements that are not source elements, in a systematic code and/or may include arbitrary code elements in a non systematic code. During reconstruction, the punctured elements may be reconstructed, in order to reconstruct other elements within the code words.

An aspect of some embodiments of the invention relates to a code in which different numbers of parity elements are generated for different source words (e.g., rows, columns and/or blocks of data) having equivalent importance. In some embodiments of the invention, different numbers of parity elements of a second (or higher) dimension are generated for the rows and/or columns of a first (or lower) dimension. The different numbers of parity elements may include, at least 3 or even 5 different numbers of parity elements for different rows. In some embodiments of the invention, at least 10 different rows have different numbers of parity elements.

The reconstruction of rows for which more parity elements were generated will generally allow for reconstruction of one or more columns and hence provide additional elements for reconstruction of the rows for which fewer redundancy elements were generated.

An aspect of some embodiments of the invention relates to a code in which parity elements of a second dimension are generated for only some of the rows of the code elements of a first dimension, e.g., only for some of the rows of the original data and/or for only some of the rows of the redundant data. Generally, the other rows will be reconstructed using the first dimension redundancy elements, after some of the rows for which second-dimension redundancy was provided are reconstructed.

The methods of the present invention were determined to achieve a higher efficiency than one-dimensional and two-dimensional FEC schemes, especially for links having high loss rates. In addition, the efficiency of the methods of the present invention has low dependence on the size of the original data and/or the link loss rate, such that the same code may be used regardless of the expected data size and link conditions.

An aspect of some embodiments of the invention relates to concurrently transmitting FEC elements representing a data block on a plurality of channels, the channels not carrying identical sequences of FEC elements. The concurrent transmission of the FEC elements on the plurality of channels generally means that the beginning and end times of the transmission of the FEC elements of the data block on the plurality of channels overlap to a large extent. It is noted, however, that the channels may use different time slots of a time division scheme, such that although the transmissions in general are concurrent, at the time slot level the signals may not be transmitted together. Optionally, the plurality of channels transmit from a single transmitter.

In some embodiments of the invention, at least one of the receivers can tune onto all the channels concurrently. The transmission of the FEC elements on a plurality of different channels in non-identical sequences, allows reception of the data block by receivers of different capabilities from different channels, while allowing receivers listening to a large number of channels to receive the data block faster.

There is therefore provided in accordance with an exemplary embodiment of the invention, a method of preparing data for transmission, comprising providing a block of data, generating a plurality of first dimension code words including first dimension forward error correction FEC elements, the elements of each code word may be used interchangeably to reconstruct a data portion of the block corresponding to the code word, defining a plurality of second dimension source words formed of the generated elements and generating for at least two of the defined second dimension source words, different numbers of parity elements.

Optionally, at least some of the first dimension FEC elements are not included in second dimension code words for which second dimension parity elements are generated.

Optionally, generating the first dimension code words comprises generating according to a systematic code. Optionally, second dimension parity elements are generated for fewer than half the first dimension elements. Optionally, generating second dimension parity elements comprises generating such that at least five of the defined second dimension source words have different code rates. Optionally, generating second dimension parity elements comprises generating such that each second dimension source word for which parity elements are generated, has a different number of elements.

Optionally, generating second dimension parity elements comprises generating parity elements in accordance with each code rate for which parity elements are generated, for a same number of second dimension source words. Optionally, generating first dimension code words comprises generating code words including different numbers of elements.

Optionally, the method includes transmitting all the generated first and second dimension elements to a receiver. Optionally, the method includes transmitting fewer than all the generated first and second dimension elements to a receiver. Optionally, first dimension elements belonging to second dimension source words for which parity elements were generated, are not transmitted. Optionally, transmitting the data comprises transmitting over a channel having a loss rate greater than 30%. Optionally, each element comprises a data packet. Alternatively, each element comprises a single bit.

There is further provided in accordance with an exemplary embodiment of the invention, a method of transmitting data, comprising providing a block of data, generating a plurality of first dimension code words of first forward error correction FEC elements, the elements of each code word may be used interchangeably to reconstruct a data portion of the block corresponding to the code word, generating one or more second dimension code words, each second dimension code word including source elements from one or more of the first dimension code words, transmitting elements representing the data block to a receiver, the transmitted elements not including at least one element belonging to both a first and second dimension code word.

Optionally, transmitting the elements comprises transmitting all the elements of the second dimension code words that do not belong to first dimension code words. Optionally, generating the first dimension code words comprises generating code words including source elements and parity elements and wherein some of the parity elements are transmitted and some of the parity elements are not transmitted. Optionally, the source elements and the transmitted parity elements of each first dimension code word are of a number required to allow, on the average, reconstruction of between about 35-50% of the code words, without the non-transmitted parity elements, taking into account an expected loss rate during the transmission. Optionally, each first dimension code word includes a number of elements sufficient to allow, on the average, reconstruction of at least 95% of the first dimension code words based on transmission of the elements of the code words, taking into account an expected loss rate during the transmission.

Optionally, each first dimension code word includes a number of elements sufficient to allow, on the average, reconstruction of less than 98% of the first dimension code words based on transmission of the elements of the code words, taking into account an expected loss rate during the transmission. Optionally, each first dimension code word includes a number of elements sufficient to allow, on the average, reconstruction of less than 95% of the first dimension code words based on transmission of the elements of the code words, taking into account an expected loss rate during the transmission.

Optionally, more than 20% of the elements common to first and second dimension codes are not transmitted. Optionally, generating second dimension code words comprises generating a plurality of code words of different code rates. Alternatively, generating second dimension code words comprises generating a plurality of code words with same code rates.

Optionally, all the common elements of first and second dimension code words of at least one code word are not transmitted. Optionally, generating second dimension code words comprises generating at least one second dimension code word having one element from each of the first dimension code words. Optionally, the method includes generating and transmitting elements of a third dimension code word. Optionally, generating the code words comprises generating according to a block code and/or a convolution code.

Optionally, transmitting the elements comprises transmitting over a plurality of different channels. Optionally, transmitting the elements comprises transmitting over a plurality of channels with different expected loss rates. Optionally, elements belonging to second dimension code words but not to the first dimension code word are transmitted on a separate channel from elements of first dimension code words. Optionally, elements belonging to second dimension code words but not to the first dimension code words are transmitted on a channel having a lower loss rate than a channel used for elements of first dimension code words.

There is further provided in accordance with an exemplary embodiment of the invention, a method of transmitting data, comprising providing a block of data, generating a plurality of FEC elements of one or more dimensions that represent the block of data, and transmitting the plurality of FEC segments over a plurality of different channels.

Optionally, generating the plurality of FEC elements comprises generating elements according to a single dimension FEC method. Alternatively, generating the plurality of FEC elements comprises generating elements according to a multi-dimension FEC method. Optionally, transmitting the plurality of FEC segments comprises transmitting all elements belonging to a same code word on a single channel. Alternatively, transmitting the plurality of FEC segments comprises transmitting elements belonging to at least one single code word on a plurality of channels.

Optionally, transmitting the plurality of FEC segments comprises transmitting on a plurality of channels having same or different loss rates. Optionally, transmitting the plurality of FEC segments comprises transmitting on a plurality of channels having different loss rates due to different transmission methods. Optionally, transmitting the plurality of FEC segments comprises transmitting only systematic FEC elements on at least one of the channels. Optionally, the method includes receiving the transmitted plurality of segments by a plurality of receivers, at least one of the receivers receives segments on fewer than all the channels on which the FEC segments are transmitted.

Optionally, generating the FEC elements comprises generating code words of one or more first dimensions and parity elements of one or more second dimensions and wherein transmitting the plurality of FEC segments comprises transmitting such that one or more channels do not carry the parity elements of the one or more second dimensions. Optionally, one or more channels carry only the parity elements of the one or more second dimensions. Optionally, the method includes receiving the transmitted plurality of segments by a plurality of receivers, at least one of the receivers receives segments on fewer than all the channels on which the FEC segments are transmitted.

Optionally, the method includes receiving the transmitted plurality of segments by a plurality of receivers, at least one of the receivers having the capability to listen concurrently to all the channels and at least one of the receivers not having the capability to listen concurrently to all the channels. Optionally, the sequences of elements of different channels differ in at least some of the elements they contain. Optionally, the sequences of elements of at least two channels include the same elements in different orders. Optionally, the sequences of elements of at least two channels do not include any common elements.

There is further provided in accordance with an exemplary embodiment of the invention, a method of receiving data, comprising tuning onto a plurality of channels, receiving FEC elements on each of the plurality of channels and reconstructing a data block using one or more FEC elements received over each of the plurality of channels.

Optionally, the plurality of channels include at least two channels having different loss rates. Optionally, receiving the FEC elements comprises receiving only parity elements on at least one of the channels. Optionally, receiving the FEC elements comprises receiving only systematic elements on at least one of the channels. Optionally, receiving the FEC elements comprises receiving elements of a single code word on at least two different channels.

There is further provided in accordance with an exemplary embodiment of the invention, a multicast transmission unit, comprising an input interface for receiving blocks of data, a processor adapted to generate a plurality of first dimension code words including first dimension forward error correction FEC elements, the first dimension elements of each code word may be used interchangeably to reconstruct a data portion of the block corresponding to the code word, to define a plurality of second dimension source words formed of the generated first dimension FEC elements and to generate for at least two of the defined second dimension source words, different numbers of parity elements and a transmitter for transmitting FEC elements generated by the processor.

Optionally, the transmitter is adapted to transmit FEC elements generated by the processor for a single block on a plurality of channels.

BRIEF DESCRIPTION OF FIGURES

Particular non-limiting embodiments of the invention will be described with reference to the following description of non-limiting exemplary embodiments in conjunction with the figures. Identical structures, elements or parts which appear in more than one figure are preferably labeled with a same or similar number in all the figures in which they appear, in which.

DETAILED DESCRIPTION OF EMBODIMENTS

Consider the situation where a transmitter is to transmit original data over a lossy channel to a receiver. In order to allow reconstruction of the transmitted data by the receiver, the transmitter generates FEC code elements, which are transmitted to the receiver.

Figure 1:
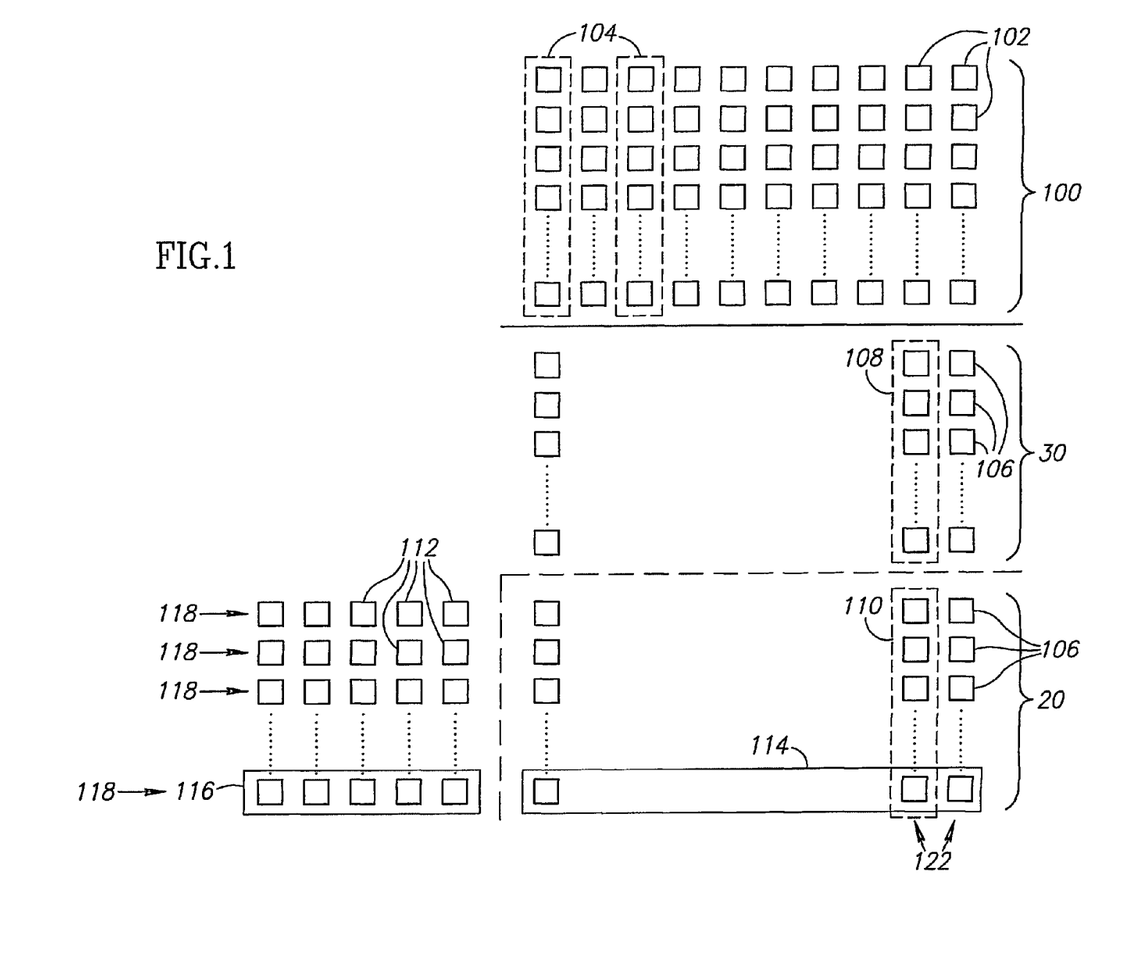
FIG. 1 is a schematic illustration of a forward error correction (FEC) code construction, in accordance with an exemplary embodiment of the invention.

FIG. 1 is a schematic illustration of a forward error correction (FEC) element arrangement, in accordance with an exemplary embodiment of the invention. The original data is optionally divided into blocks of a predetermined size, each block is handled separately as is now described with reference to FIG. 1, which shows a single block 100. The size of block 100 is optionally selected according to the processing resources of the receivers that need to reconstruct the data.

Block 100 is divided into a plurality (e.g., 1000) of source elements 102 organized in first-dimensional (column) source words 104. In the example of FIG. 1, ten column source words 104, each including one hundred source elements 102, are constructed for each block 100. For each column source word 104, parity elements 106 are generated in accordance with a systematic code. The column source word 104 together with the parity elements 106 form a column code word 122. The parity elements 106 of each column code word 122 are optionally divided into a first parity sub-word 108 and a second parity sub-word 110. The parity elements 106 of the first parity sub-words 108 are optionally transmitted to the receiver, while the parity elements 106 of the second parity sub-words 110 are not transmitted to the receiver.

In the example of FIG. 1, each source word 102 includes 100 elements, each first parity sub-word 108 includes 30 elements and each second parity sub-word 110 includes 20 elements. In this example, 60% of the parity elements 106 belong to first parity sub-words 108, while 40% of the parity elements 106 belong to second parity words 110. Naturally, other percentages may be used. Particular expected values range between about 55-75% of parity elements 106 belonging to first parity sub-words 106, although other ranges (e.g., 30-50%) may also be useful.

Parity elements 106 are optionally generated using any suitable FEC code method known in the art. In some embodiments of the invention, a convolution code is used to generate the parity elements. Alternatively or additionally, the elements are generated using a block code. In some embodiments of the invention, the elements are generated using both convolution and block codes, some code words using one FEC code method while other code words use another FEC code method. Optionally, code words of different dimensions use different FEC methods (e.g., block and convolution). Alternatively or additionally, different code words of the same dimension use different FEC methods.

The non-transmitted parity elements 106 of sub-words 110 are optionally included in second-dimension (row) source words 114. In some embodiments of the invention, for each row word 114, a second-dimension row parity word 116 of second dimension parity elements 112 is generated. These second dimension parity elements 112 are transmitted to the receiver in order to aid in reconstruction of the original data. Row source words 114 and their respective row parity words 116 are referred to together as row code words 118. In some embodiments of the invention, the elements of row source words 114 are first dimension parity elements, while in the second dimension they serve as source elements.

The transmission of row parity words 116 instead of row source words 114 increases the efficiency of the code. This is especially true for a transmission with large expected variations in the total number of source elements 102 and parity elements 106 received for different code words 122. The reception of additional elements 102 and/or 106 from row source words 114 would be redundant for column code words 122 that have sufficient elements without the elements of row source words 114, and would not aid the reconstruction of other columns, as the columns are not inter-related. The elements of row parity words 116, on the other hand, can be used for reconstructing any of the column source words 104.

The generation of parity words 116 only for some of the first dimension parity elements 106, i.e., for the parity elements 106 of the second parity words 110, reduces the amount of data transmitted over the channel, while achieving the benefits of the invention. Optionally, the parity elements 106 for which second dimensional row parity words 116 are generated, are selected arbitrarily and/or randomly, without relation to their contents. Furthermore, alternatively to generating second dimensional parity words 116 for first dimension parity elements 106, the second dimensional parity words 116 may be generated for one or more rows of source elements 102. Optionally, in this alternative, the rows of source elements 102 for which second dimension parity rows 116 are generated, are not transmitted.

In some embodiments of the invention, the number of parity elements 106 in the first parity sub-word 108 is selected according to the expected loss rate of the channel, so that the number of column source words 104 which may be reconstructed by the receiver using only the received source elements 102 and the received parity elements 106 of the first parity sub-words 108, is about a desired percentage. In an exemplary embodiment of the invention, the desired percentage is between about 35-50%, e.g., 40%. The desired percentage is optionally selected as a low enough percentage to prevent there being too many columns receiving many more elements than required for reconstruction, while ensuring easy reconstruction of row source words 114 without transmitting too many second dimension parity elements 112.

The number of parity elements 106 in second parity sub-words 110 is optionally selected according to the loss rate of the channel, such that the number of column source words 104 which can be reconstructed by the receiver using the received elements, if source elements 102 are transmitted with all the parity elements 106 (of both the first and second parity sub-words 108 and 110) but no row parity elements 112 are transmitted, is between about 95-100%.

The number of second dimensional parity elements 112 generated is optionally selected so that the row source words 114 can be reconstructed given the loss rate of the channel and the number of column code words 122 which are expected to be reconstructed without the second dimensional parity elements 112.

Alternatively to generating the same number of second dimension parity elements 112 for all the row source words 114, different numbers of second dimensional parity elements 112 are generated for different row source words 114. Stated otherwise, the second dimension code has different code rates for different row source words 114. Optionally, the numbers of second dimensional parity elements 112 generated for different row source words 114 span over a large range of numbers, for example between 1 and a maximal number of elements 112 generated for a row source word 114. In some embodiments of the invention, the numbers of second dimensional elements 112 generated for different row source words 114 is distributed evenly over the range from which the number of elements is taken. Alternatively or additionally, the row source words 114 are divided into substantially same size groups, and each group has a different number of second dimension parity elements 112.

In some embodiments of the invention, the second dimensional parity elements 112 are organized in a triangle with decreasing numbers of elements 112 in each row parity word 116. For example, when there are twenty row source words 114, a first row parity word 116 has twenty second dimensional parity elements 112, a second row parity word 116 has nineteen parity elements 112 and so on until a last row parity word 116 has only a single parity element 112. The use of decreasing numbers of elements is found to be efficient since after reconstruction of one row source word 114, more column source words 104 are expected to be reconstructed and therefore other row source words 114 will be reconstructable using fewer second dimensional parity elements 112. This process repeats until all the original column source words 104 are reconstructed.

Alternatively to using an isosceles triangle of parity elements 112, any other triangular or non-triangular arrangement of elements in parity words 116 may be used, for example based on simulations of the expected reconstruction possibilities. For example, second dimensional redundancy elements 112 are optionally organized in a non-isosceles triangle, a trapezoid, a concave or a convex structure which maximizes the efficiency of the code.

In some embodiments of the invention, the structure of the code (e.g., the number of columns and/or rows) and other details of the FEC method are preconfigured in both the transmitter and the receiver. Alternatively, the code structure details are transmitted at the beginning of the transmission and/or periodically to the receiver.

The second dimension source words 114 are described above as including first dimension parity elements 106. In other embodiments of the invention, the second dimension source words 114 include first dimension source elements 102 or some second dimension source words 114 including first dimension source elements 102 and other second dimension source words 114 include first dimension parity elements 106.

Figure 2:
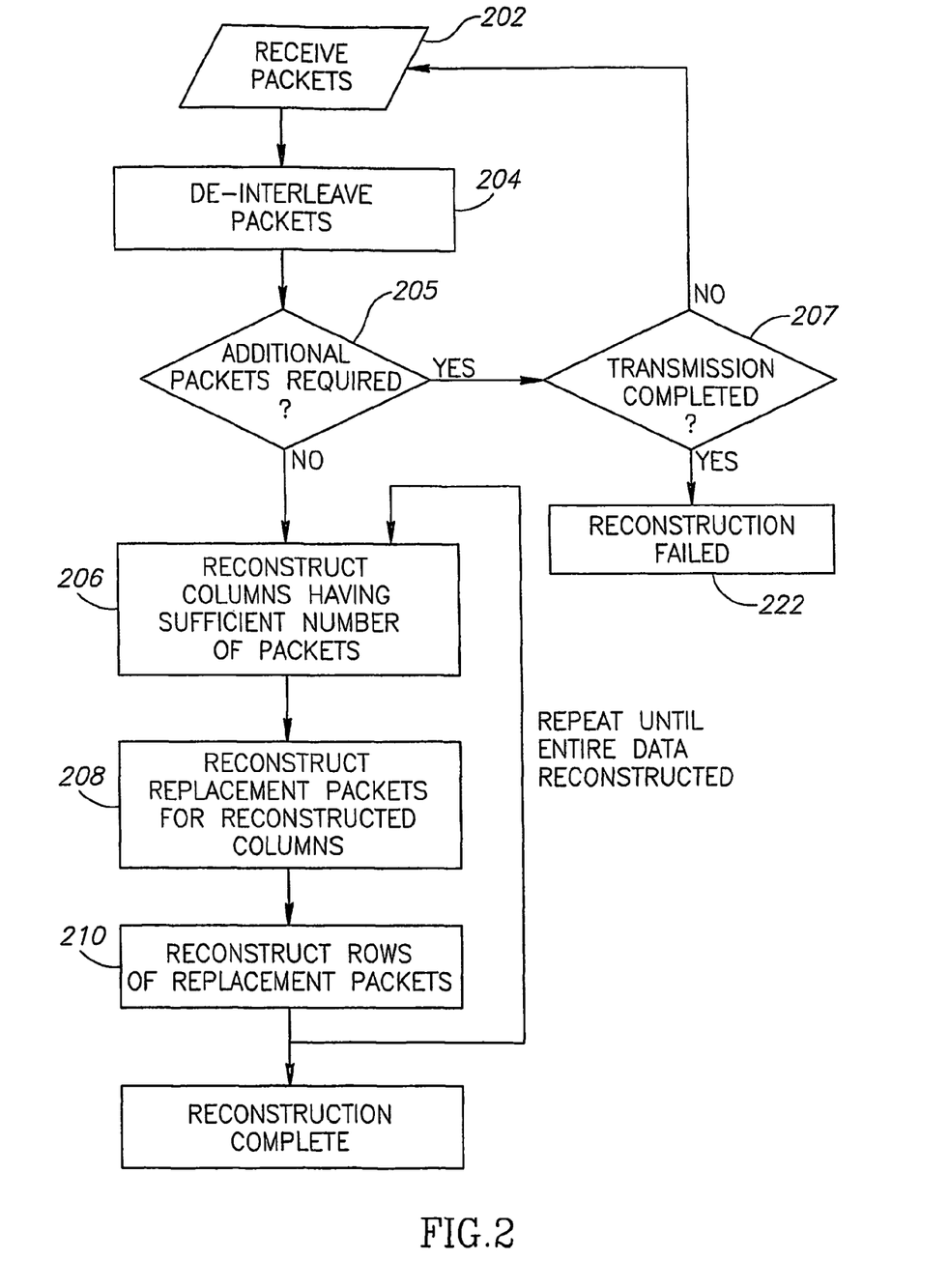
FIG. 2 is a flowchart of acts performed by the receiver in reconstructing the original data, in accordance with an exemplary embodiment of the invention.

FIG. 2 is a flowchart of acts performed by the receiver in reconstructing the original data, in accordance with an exemplary embodiment of the invention. The elements actually received (202), i.e., detected and utilized by the receiver, are de-interleaved (organized) (204) in the format of FIG. 1, generally based on identification headers included in the elements. If (205) additional elements are required for reconstruction, and the transmission was not completed (207), the receiver continues to receive (202) more elements. If the transmission was completed, without the receiver accumulating a group of elements required to reconstruct the data block, the reconstruction failed (222). The receiver may request supplementary transmission of additional elements or may request retransmission of the entire data block. If (205) additional elements are not required, iterative reconstruction of the data block is performed, as is now described.

For each column code word 104 for which the receiver has a sufficient number of elements 102 and/or 106, the receiver reconstructs (206) the column source word 104. Thereafter, the parity elements 106 of the column code word 122 are reconstructed (208). It is noted that the reconstruction (206) of the source elements 102 is not performed based on parity elements 106 of the second parity sub-word 110 since they are not transmitted at all. On the other hand, the generation (208) of the parity elements 106 includes elements of both the first parity sub-words 108 and second parity sub-words 110.

For each row code word 118 for which the receiver has a sufficient number of elements (including both first dimension parity elements 106 and second dimension parity elements 112), the receiver reconstructs (210) the parity elements 106 of row source words 114. Thereafter, the receiver repeats the reconstructing (206) of the column source words 104 that have sufficient elements for reconstructing, in view of the reconstruction performed on row code words 118. The first dimension generation (208) of parity elements 106, the second dimension reconstruction (210) of parity elements 106 and the reconstruction (206) of source elements 102 are repeated until the data block is reconstructed or no additional row or column code words were reconstructed.

Referring in more detail to determining (205) whether additional elements are required, in some embodiments of the invention, based on the number of elements in each column source word 104, the receiver determines which column source words 104 can be reconstructed. Thereafter, based on the number of elements received or reconstructed successfully from each row code word 118, the receiver determines which row code words 118 can be reconstructed. According to the results, the receiver optionally determines which column source words 104 can be reconstructed. This procedure is optionally repeated iteratively until it is determined whether or not the block can be reconstructed. Alternatively to performing exact simulations, the question of whether additional elements are required is determined based on an estimation. Optionally, in this alternative, a safety margin is taken in order to ensure that when it is determined that additional elements are not required, the chances that the reconstruction will not succeed is close to zero. In an exemplary embodiment of the invention, the estimation of whether additional elements are required is based on the number of elements received. The required number is optionally sufficiently high, such that the chances of reconstructing the data block are sufficiently high.

In some embodiments of the invention, as shown in the reconstruction method of FIG. 2, the reconstruction is performed after all the transmitted data is received. Thus, the processing resources used for the reconstruction are kept low. Alternatively, the reconstruction is attempted after a predetermined number of elements are successfully received, while additional data is being received on the channel.

In some embodiments of the invention, for example in a multicast channel, the transmission is continued for a predetermined time which is expected to be sufficient for all or nearly all receivers to receive the data. In an exemplary embodiment of the invention, the transmission has a duration of 3-4 times that required for transmission of the data on a lossless channel. Alternatively or additionally, the transmission is terminated responsive to acknowledgement that the data was received by a predetermined number of receivers (in a unicast channel, by the receiver).

Alternatively to the receiver listening to the channel until the data is completely reconstructed, the receiver listens to the channel for a predetermined time and/or until a predetermined number of elements are accumulated. The receiver then stops listening to the channel until the initial reconstruction process is completed or is performed for a predetermined number of rounds. According to the results of the initial reconstruction and optionally the time remaining for which the data will still be transmitted, the receiver then listens to the channel for an additional period. The reconstruction is continued using the data from the additional listening to the channel. This alternative is especially useful when the processing power required for signal reception is greater than required for reconstruction of the original data.

The present invention may be employed on substantially any transmitter, receiver and/or channel including wireless LAN, cellular, packet based, ATM and satellite networks. The present invention is especially useful for high loss networks, such as for data passing on noisy channels with a loss rate of above 10% or even above 30%. The high loss may also be due to the receiver listening to only a portion of the transmitted data, for example due to a late tuning on to the channel. Such late tuning may especially occur on a multicast channel, when a plurality of different receivers want to receive the same data and therefore all need to tune on to the same channel.

In an exemplary embodiment of the invention, the present invention is used for transmission of data to a plurality of wireless receivers on a multicast channel. Optionally, the data is transmitted after encoding with a code having a code rate between about 0.2-0.4, such that data which requires 2 minutes for uncoded transmission requires between 5-10 minutes for coded transmission. Such a redundancy corresponds to a loss rate of about 70-80%.

In some embodiments of the invention, in addition to first dimension parity elements 106 and second-dimension redundancy elements 112, the transmitter may generate and/or transmit additional elements, such as second dimensional FEC elements on source elements 102 and/or third dimensional code elements. In some embodiments of the invention, second-dimensional redundancy elements 112 are transmitted with a higher protection rate than source elements 102 and/or on a separate channel having a lower average loss rate. In these embodiments, the size of first parity sub-words 108 is optionally reduced accordingly, taking into account the increased reliability of the second-dimensional redundancy elements 112.

Although in the above description the parity elements 106 which were generated but not transmitted belong to the first dimension, the same principal may be used for any other dimension, such as second or third dimension parity or source elements. The elements which were generated but not transmitted may belong to a single code word or to a plurality of code words in a plurality of dimensions.

Figure 3:
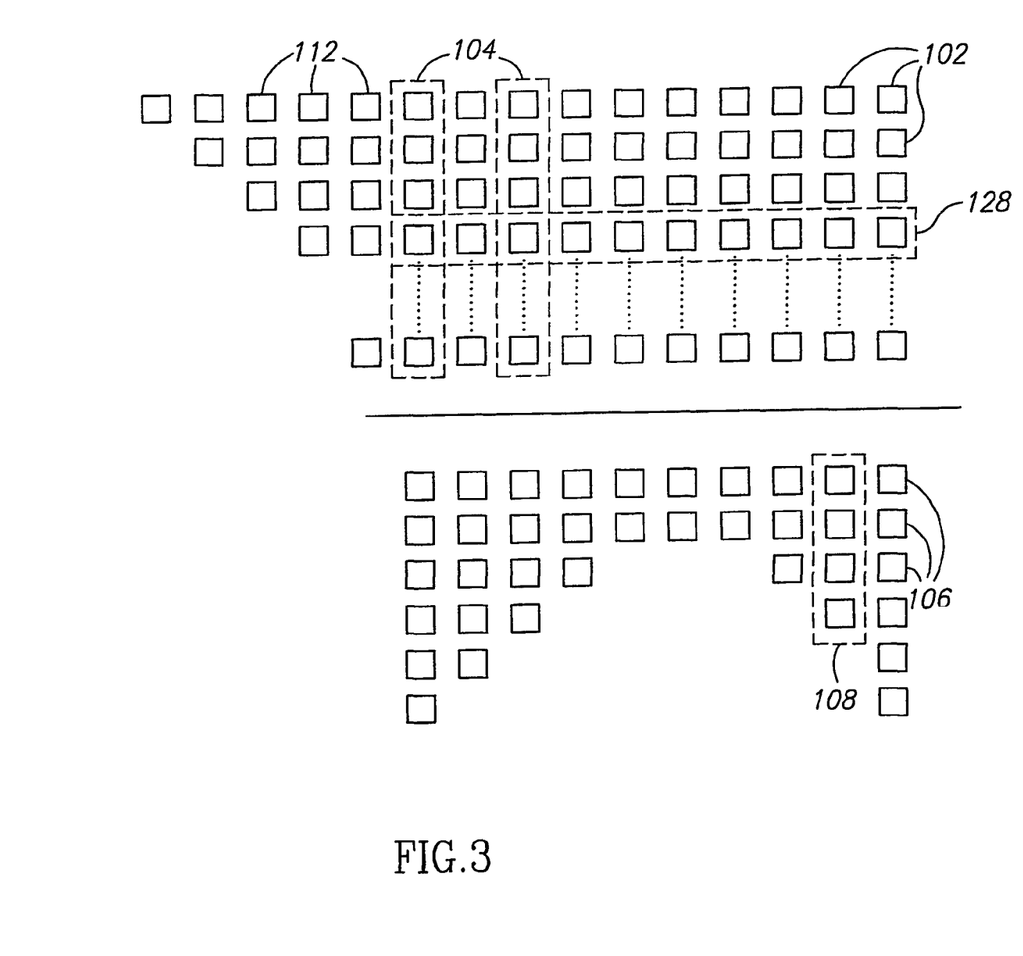
FIG. 3 is a schematic illustration of a code construction, in accordance with another exemplary embodiment of the invention.

FIG. 3 is a schematic illustration of a forward error correction (FEC) element construction, in accordance with another exemplary embodiment of the invention. A block of original data is divided into source elements 102, organized in a two dimension array of column source words 104 and row source words 128. For each column source word 104, first-dimension parity elements 106 are generated, with optionally different numbers of parity elements 106 being generated for different column source words 104. For each row source word 128, second dimension row parity elements 112 are generated. Optionally, also in generating row parity elements 112, different numbers of elements are generated for different row source words 128. In some embodiments of the invention, second-dimension parity elements 112 are generated only for source elements 102. Alternatively, second dimensional parity elements 112 are generated also for first dimension parity elements 106.

In some embodiments of the invention, a maximal number and a minimal number of second dimension elements 112 are provided. The number of parity elements 112 for each row source word 128 is optionally selected so as to have a gradually decreasing number of parity elements 112 from the maximal number to the minimal number along the row source words 128. Alternatively, several predetermined code rates are defined for the number of second dimension row code words. For example, each row source word 128 may optionally have one of three possible numbers of second dimension parity elements 112, corresponding to a low protection level, a medium protection level and a high protection level.

In some embodiments of the invention, all the source elements 102, first dimension parity elements 106 and second dimension parity elements 112 are transmitted to the receiver. Alternatively, some of the source elements, for example from the source elements which are most protected, are not transmitted. Generally, rows and/or columns for which fewer elements were received will be reconstructed based on reconstructed elements of other columns and/or rows.

Alternatively to having different numbers of parity elements both for different columns and for different rows, the use of different numbers of elements may be used only for different rows or only for different columns.

Optionally, the source elements 102 of different row and/or column code words have the same importance. The use of different codes for different code words is used herein based on statistical assumptions and is optionally not related to attempts to protect data portions of different importance using different code rates. In some embodiments of the invention, a scheme which incorporates different code rates for statistical purposes and uses different code rates for data of different importance is used.

In simulations performed on a channel having a loss rate of 30%, the one dimensional FEC method was determined to have an 86% efficiency, the second dimensional FEC was determined to have a 93% efficiency and a method in accordance with the present invention was found to have an efficiency of 96%. The simulations in accordance with the present invention were performed using 20 first dimension column code words having X=172 source elements and Y=172+48 code elements. Second dimension parity elements 112 were generated for 22 rows, each having a different number of parity elements 112 between 1 to 22.

As mentioned above, in some cases different elements are transmitted on different channels with different protection levels. In some embodiments of the invention, second dimension parity elements 112 are transmitted on a channel with a higher protection level, due to their general nature which can aid in decoding many first dimension code words. Alternatively or additionally, data known to have more importance in a higher protocol layer is transmitted on a channel with a higher protection level, for example as described in PCT application PCT/IL2004/000204, titled "Segmented Data Delivery Over Non-Reliable Link", filed Mar. 3, 2004, the disclosure of which is incorporated herein by reference.

The use of a plurality of different channels for transmission of the elements of a single block may be advantageous for other reasons than providing higher level protection to specific elements. In some embodiments of the invention, some of the elements of each first dimension code word are transmitted on a first channel, while other elements of the first dimension code words are transmitted on a second channel. Optionally, in these embodiments, the percentage of elements transmitted on the different channels is different for different first dimensional code words. The use of different channels varies the number of elements received for different code words and hence allows for an increase in the chances that the second parity elements 112 are effective for reconstruction of first dimensional code words.

In some embodiments of the invention, the use of the plurality of channels is an attribute of the transmission system used. Instead of using different channels for different data blocks, the FEC elements of at least one of the data blocks are transmitted on a plurality of channels. In some cases, different receivers have different tuning capabilities. Some receivers, for example, can listen only to a first group of channels, e.g., including 1 channel, while other receivers, can listen to a second group of channels greater than the first group, e.g., including 2 channels. In another example, some receivers listen to at most six channels while other receivers listen to nine or more channels. The number of channels is not relevant to the invention and the advantages of dividing the FEC elements of a single block to a plurality of channels pertains to substantially any number of channels.

In some embodiments of the invention, a first group of receivers is capable of tuning onto a first set of one or more channels and a second group of receivers is capable of tuning onto a second set of channels not including any channels of the first set. A third set of receivers is capable of tuning onto the channels of the first set and of the second set, or on sub-sets of the channels of both the first and second sets. Preferably, each of the sets of channels carries a sufficient number of elements required for decoding the corresponding data block. In some embodiments of the invention, during transmission of the FEC elements, the first and second channels carry sets of elements which are at least partially different so that receivers listening to both the first and second sets of channels do not receive the same elements twice and hence receive a number of elements required for decoding faster than if they would listen only to a single set of channels. Alternatively or additionally, both sets of channels carry the same FEC elements but in a different order, so that a receiver listening to both channels will receive different elements on the channels to which it is tuned.

It is noted that the advantages of dividing the FEC segments of a single data block between a plurality of channels, are not limited to the above described multi-dimensional FEC scheme, and the division of segments may be used with substantially any FEC scheme, including a simple one dimensional FEC scheme. For example, a first number of FEC segments of each code word may be transmitted on a channel or channels to which all receivers are tuned, while additional FEC segments of each code word are transmitted on an additional channel to which only some receivers are tuned. Thus, receivers tuned to the additional channel generally receive the data blocks within a shorter period. In some embodiments of the invention, when a multi-dimensional FEC is used, the segments of code words of a first dimension are transmitted on channels to which all the receivers are tuned, while parity elements of one or more other dimensions are transmitted on a second channel.

In other embodiments of the invention, the segments of different code words of a same data block are transmitted on different channels. In these embodiments, all the receivers are optionally expected to listen to both channels. The distribution of the code words between two (or more) channels reduces the time required in order to receive each block, allowing faster decoding and utilization, e.g., display, of the data block.

In some embodiments of the invention, some of the receivers do not support FEC at all, while other receivers support using FEC. Optionally, a first channel directed to all receivers carries the systematic segments, while a second channel to which only some receivers are tuned, carries parity elements. The first channel may have a very low loss rate and/or may carry a plurality of instances of the systematic segments.

The channels used to carry the parity elements of a single data block optionally differ in their frequencies and/or codes. Alternatively or additionally, the channels differ in their time schemes and/or are transmitted from different transmitters, for example using a multi-input multi-output (MIMO) scheme. In some embodiments of the invention, the different channels have the same loss rate. Alternatively, some or all of the channels have different loss rates, for example due to different noise conditions and/or different encoding methods.

The above described methods may be used for source and parity elements 102 and 106 of different sizes, including elements which are packets and elements which are single bits. The term code element refers herein to any element which can be used to reconstruct the original data, whether the element is a source element or a parity element and/or whether the element belongs to a systematic or non-systematic code word.

The references to first and second dimensions are used herein for simplicity and the present invention may be used on codes of any number of dimensions, on some or all of the dimensions thereof. The terms first and second dimensions appearing in the claims may refer to any two of the dimensions of the code, including the first two dimensions and the last two dimensions.

It will be appreciated that the above described methods may be varied in many ways, including, changing the order of steps, and the exact implementation used. The methods of the present invention may be performed in various protocol layers and may be performed for a single transmission system in a plurality of communication protocol layers. It should also be appreciated that the above described description of methods and apparatus are to be interpreted as including apparatus for carrying out the methods and methods of using the apparatus.

The present invention has been described using non-limiting detailed descriptions of embodiments thereof that are provided by way of example and are not intended to limit the scope of the invention. For example, although the above description relates to a systematic FEC, the methods of the invention may be employed similarly on non-systematic FEC methods. It should be understood that features and/or steps described with respect to one embodiment may be used with other embodiments and that not all embodiments of the invention have all of the features and/or steps shown in a particular figure or described with respect to one of the embodiments. Variations of embodiments described will occur to persons of the art.

It is noted that some of the above described embodiments may describe the best mode contemplated by the inventors and therefore may include structure, acts or details of structures and acts that may not be essential to the invention and which are described as examples. Structure and acts described herein are replaceable by equivalents which perform the same function, even if the structure or acts are different, as known in the art. Therefore, the scope of the invention is limited only by the elements and limitations as used in the claims. When used in the following claims, the terms "comprise", "include", "have" and their conjugates mean "including but not limited to".

The invention claimed is:

1. A method of transmitting data, comprising:
providing a block of data to a processor;
generating, by the processor, a plurality of Forward Error Correction (FEC) elements of one or more dimensions that represent the block of data; and
transmitting, from the processor, the plurality of FEC elements over a plurality of different channels, having different loss rates, concurrently, the channels carrying sequences of FEC elements that are not identical
wherein the processor is adapted to select FEC elements considered to have more importance for transmission on a channel having a higher protection level.

2. A method according to claim 1, wherein generating the plurality of FEC elements comprises generating elements according to a single dimension FEC method.

3. A method according to claim 1, wherein generating the plurality of FEC elements comprises generating elements according to a multi-dimension FEC method.

4. A method according to claim 1, wherein transmitting the plurality of FEC elements comprises transmitting all elements belonging to a same code word on a single channel.

5. A method according to claim 1, wherein transmitting the plurality of FEC elements comprises transmitting elements belonging to at least one single code word on a plurality of channels.

6. A method according to claim 1, wherein transmitting the plurality of FEC elements comprises transmitting on a plurality of channels having same loss rates.

7. A method according to claim 1, wherein transmitting the plurality of FEC elements comprises transmitting on a plurality of channels having different loss rates due to different transmission methods.

8. A method according to claim 1, wherein transmitting the plurality of FEC elements comprises transmitting only systematic FEC elements on at least one of the channels.

9. A method according to claim 1, wherein generating the FEC elements comprises generating code words of one or more first dimensions and parity elements of one or more second dimensions and wherein transmitting the plurality of FEC elements comprises transmitting such that one or more channels do not carry the parity elements of the one or more second dimensions.

10. A method according to claim 9, wherein one or more channels carry only the parity elements of the one or more second dimensions.

11. A method according to claim 1, comprising receiving the transmitted plurality of elements by a plurality of receivers, at least one of the receivers receives elements on fewer than all the channels on which the FEC elements are transmitted.

12. A method according to claim 1, comprising receiving the transmitted plurality of elements by a plurality of receivers, at least one of the receivers having the capability to listen concurrently to all the channels and at least one of the receivers not having the capability to listen concurrently to all the channels.

13. A method according to claim 1, wherein the sequences of elements of different channels differ in at least some of the elements they contain.

14. A method according to claim 13, wherein the sequences of elements of at least two channels do not include any common elements.

15. A method according to claim 1, wherein the sequences of elements of at least two channels include at least 50% elements in common but in different orders.

16. A multicast transmission unit, comprising:

an input interface for receiving blocks of data;

a processor adapted to generate a plurality of forward error correction (FEC) elements; and a transmitter for transmitting FEC elements generated by the processor on a plurality of different channels having different loss rates, and to select FEC elements considered to have more importance for transmission on a specific channel having a higher protection level.

17. A transmission unit according to claim 16, wherein the transmitter is adapted to transmit FEC elements generated by the processor for a single block on a plurality of channels.

* * * * *